United States Patent [19]
Miyatake

[11] Patent Number: 5,410,514
[45] Date of Patent: Apr. 25, 1995

[54] SINGLE CLOCK MEMORY HAVING A PAGE MODE

[75] Inventor: Hisatada Miyatake, Ohtsu, Japan

[73] Assignee: International Business Machines Corporation, Armonk, N.Y.

[21] Appl. No.: 215,245

[22] Filed: Mar. 21, 1994

[30] Foreign Application Priority Data

Mar. 23, 1993 [JP] Japan .................. 5-063888

[51] Int. Cl.6 .............................................. G11C 8/00
[52] U.S. Cl. .................................. 365/238.5; 354/233; 354/235
[58] Field of Search ...................... 365/238.5, 233, 235

[56] References Cited

U.S. PATENT DOCUMENTS

| | | | |
|---|---|---|---|
| 4,625,870 | 6/1987 | Kumanoya et al. | 365/233 |
| 4,685,084 | 8/1987 | Canepa | 365/238.5 |
| 4,750,839 | 6/1988 | Wang et al. | 365/233 |
| 4,789,966 | 12/1988 | Ozaki | 365/238.5 |
| 4,833,650 | 5/1989 | Hirayama et al. | 365/238.5 |
| 4,876,671 | 10/1989 | Norwood et al. | 365/233 |
| 4,970,418 | 11/1990 | Masterson | 365/238.5 |

FOREIGN PATENT DOCUMENTS 63-248000 10/1988 Japan .................. 365/238.5
1-146193 6/1989 Japan .

Primary Examiner—Joseph A. Popek
Assistant Examiner—Tan Nguyen
Attorney, Agent, or Firm—William P. Skladony; James M. Leas

[57] ABSTRACT

The present invention realizes page mode memory access in a single clock memory. A control signal PAGE, one level of which designates an ordinary mode and the other level of which designates a page mode, is provided to a single clock memory from the outside. A mode state identification circuit identifies four mode states, ordinary mode, page-in, during-page, and page-out, by decoding the combination of the control signal levels in two consecutive memory cycles. A memory control circuit part of a memory array is thereby controlled based on the result of the identification.

11 Claims, 9 Drawing Sheets

SINGLE CLOCK MEMORY HAVING A PAGE MODE

FIELD OF THE INVENTION

The present invention relates to a single clock memory that can execute a page mode.

BACKGROUND OF THE INVENTION

There are two types of memories; single clock memory and double clock memory. The single clock memory is a memory which takes in both row and column addresses in response to a single clock signal. FIG. 8 shows a typical circuit configuration of this type of a dynamic random access memory (DRAM). In the single clock memory shown in FIG. 8, row address A0 through A10 and column address A11 through A21 are applied to their respective address input terminals and entered simultaneously into a row address buffer and a column address buffer by a single clock signal −CE (negative polarity signal of CE).

On the other hand, the double clock memory is a memory which takes in both row and column addresses at different timing in address multiplexing. FIG. 9 shows a typical circuit configuration of a double clock memory DRAM. In the memory shown in FIG. 9, row and column addresses are applied sequentially to the same address input terminals A0 through A10, the row address being entered into a row address buffer by row address strobe signal −RAS (negative polarity signal of RAS), the column address being entered into a column address buffer by a column address strobe signal −CAS (negative polarity signal of CAS).

When −RAS is active (low level), the double clock DRAM latches (holds) the row address and the sense amplifier of the memory cell array latches data. A data access called page mode can now be implemented in the double clock DRAM. The page mode is a mode of accessing individual memory cells by fixing one row address provided to the DRAM, and then continuously providing different column addresses to the DRAM.

The single clock DRAM makes it a condition that row and column addresses are generated simultaneously, and the row circuits (such as the sense amplifier) and the column circuits are controlled by a single external clock. Consequently, terminating an access to a memory cell resets the row and column addresses latched in the memory. As a result, there exists a problem that the single clock DRAM cannot implement the page mode that is allowed with the double clock DRAM.

In addition, there emerges another problem that even if the single clock DRAM is given the row address holding function and data holding function, the page mode cannot be immediately performed. The page mode and the ordinary mode differ from each other in the control process within the memory. The page mode requires modification of the control process performed in the ordinary mode. That is, the page mode requires execution of the memory control process specific to each phase or state of the page mode, such as "start of page mode," "during-page mode" and "end of page mode." So it requires identifying these operation states. The simplest method for identifying the operation mode states is to use two bits to identify the above states but this method requires the addition of two external control lines, and is not preferable.

SUMMARY OF THE INVENTION

Therefore, an object of the present invention is to allow the page mode to be executed with ease in a single clock memory which takes in both row and column addresses in response to a single external clock signal.

Another object of the invention is to provide a simple method for setting the page mode in the single clock memory and identifying the state thereof.

The inventor of the present invention has found that certain modifications of the memory control circuit allow a page mode function to be incorporated into an ordinary single clock memory. The page mode requires control processes specific to the page mode, such as the row address holding function. This can be done by modifying the memory circuit so that the control steps ordinarily performed in the single clock memory are partly omitted.

The addition of a single binary, external control signal, having a first level indicating the ordinary mode and a second level indicating the page mode allows the identification of mode states such as the start of page mode, during-page mode and end of page mode.

The single clock memory of the present invention has a state identification circuit for identifying the operation mode state such as the start of page mode, during-page mode, and end of page mode. The mode state identification circuit receives a single control signal, the first level of which indicates the ordinary mode, and the second level of which indicates the page mode, to determine the mode state based on the combination of the levels of the control signal in consecutive memory cycles.

The single clock memory of the present invention further comprises a memory control means for performing predetermined memory control processes in correspondence with the state identified by the mode state identifying circuit. The memory control means selectively omits part of the memory control operations performed in the ordinary mode to result in the operation of the page mode.

Furthermore, the present invention provides a method for setting the page mode in a single clock memory and determining the state of the page mode.

DETAILED DESCRIPTION OF THE INVENTION

An embodiment of the present invention will be described below with reference to the drawings.

Figure 1:
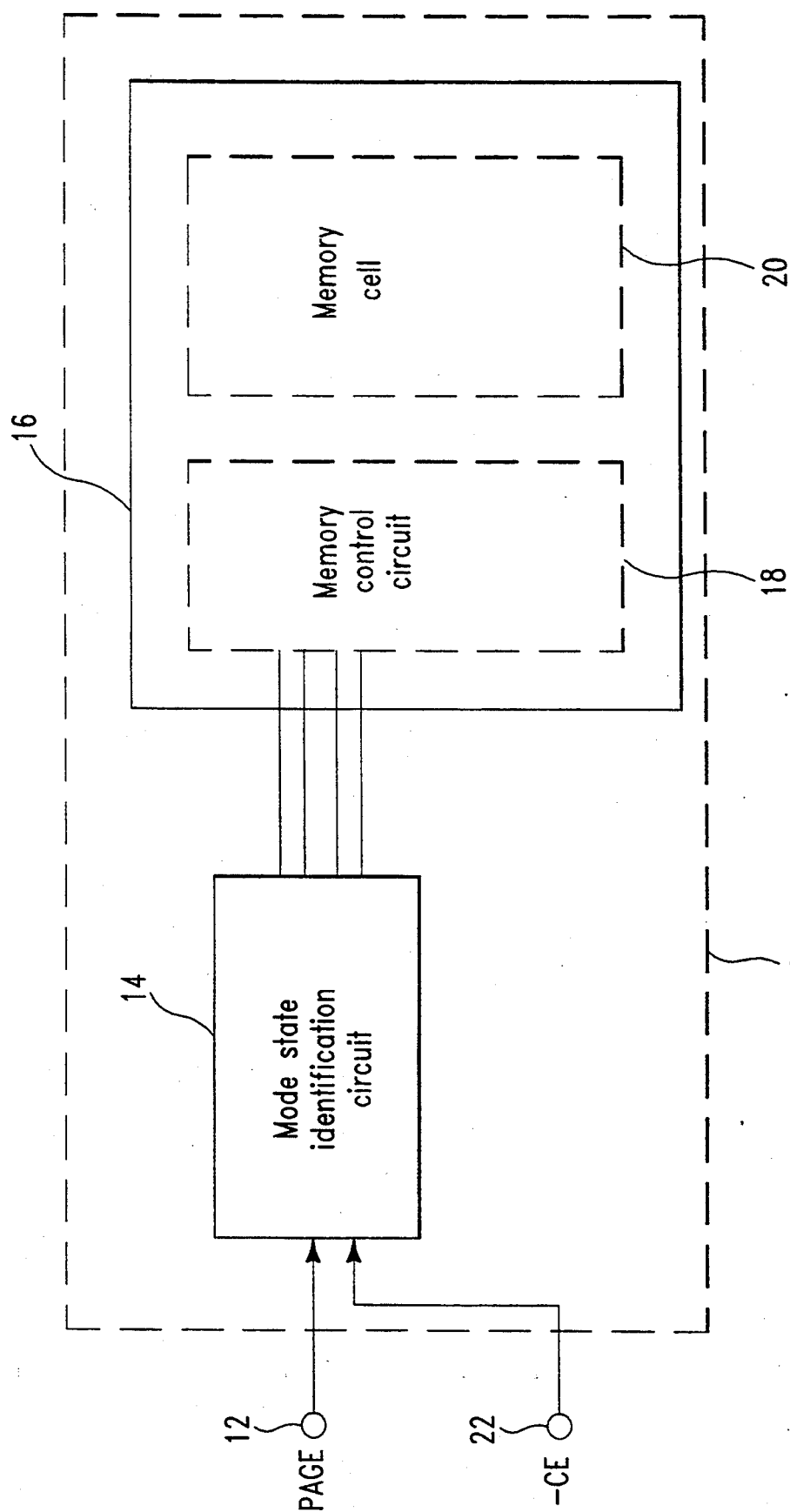
FIG. 1 is a block diagram showing the main configuration of one embodiment of the present invention.

FIG. 1 shows a schematic circuit configuration in which the present invention is applied.

Figure 8:
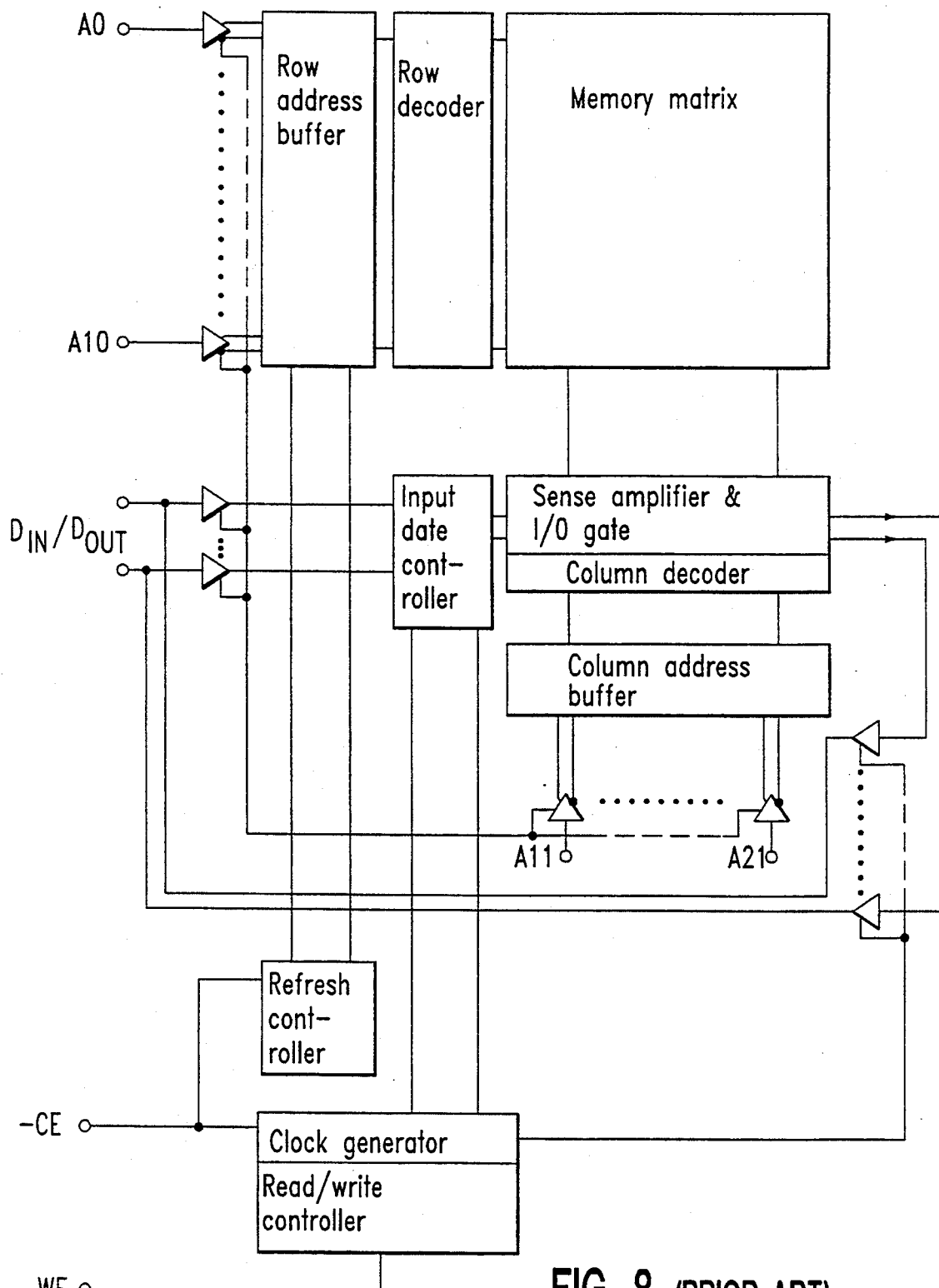
FIG. 8 is a block diagram showing the configuration of a prior art single clock memory.
Figure 9:
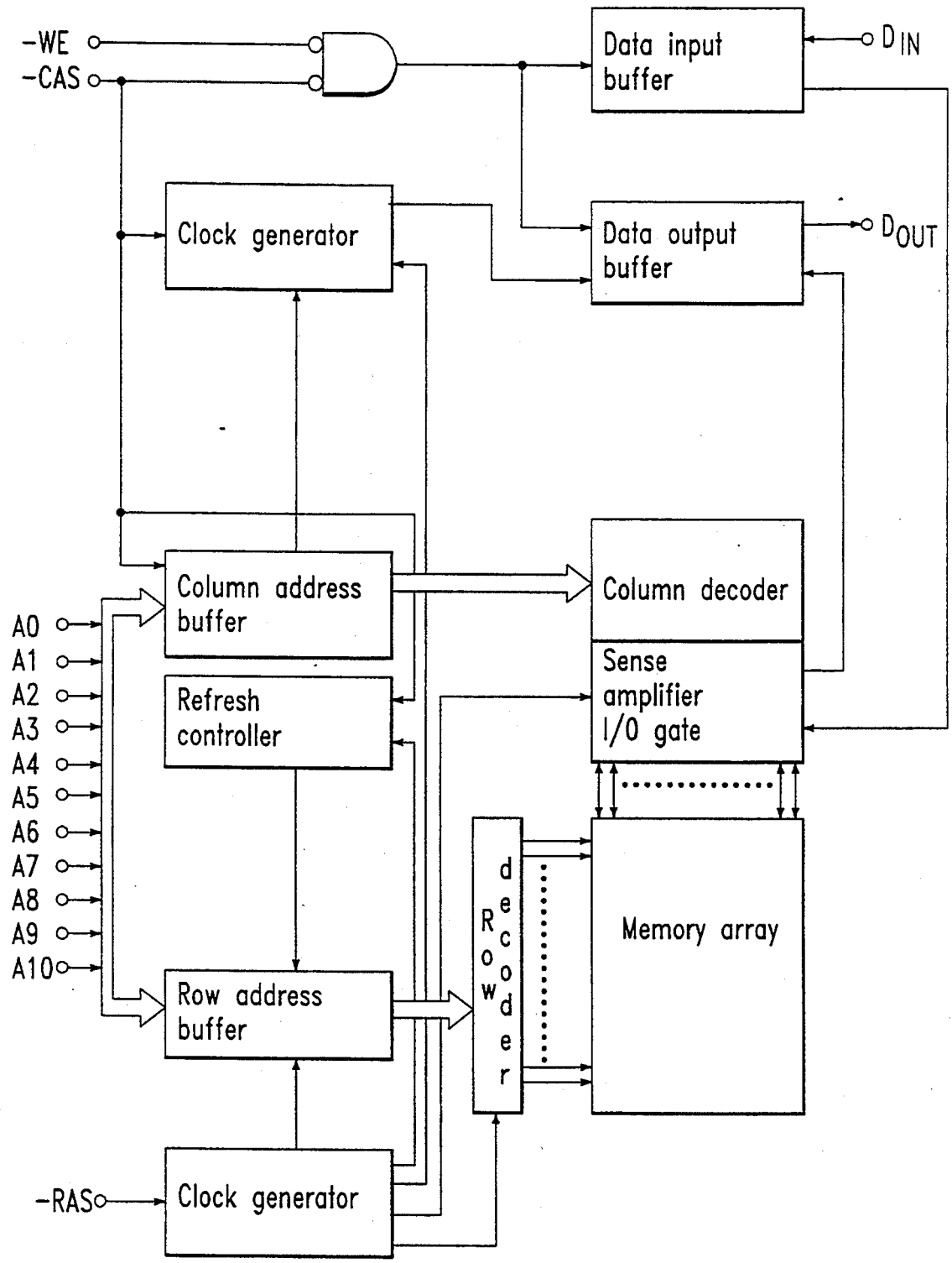
FIG. 9 is a block diagram showing the configuration of a prior art double clock memory.

The single clock memory 10 of the present invention has control input terminal 12 and a mode state identification circuit 14. A 1 bit external control signal PAGE is applied to the control input terminal 12 from a controller such as a processor. The control signal PAGE is inputted when row/column address signals are inputted (FIG. 8). The control signal PAGE selectively designates the ordinary mode and the page mode. As described hereinbelow, the control signal PAGE is further used to identify the mode states of "start of page mode" (hereinafter referred to as page-in), "during-page mode" (hereinafter referred to as during-page) and "end of page mode" (hereinafter referred to as page-out). In one embodiment of the invention, for example, a stable low signal on PAGE can be used to represent the "ordinary" memory mode; the transition from a low to a high state can be used to represent the "start of page" mode, a stable high signal can represent "during page" mode, and a transition from a high state to a low state can represent "end of page" mode. The mode state identification circuit 14 decodes the control signal to identify the mode state of the memory.

Signals representing these four mode states (ordinary mode, page-in, during-page, and page-out) are transmitted to a memory array 16. The memory array 16 includes a memory cell part 20 for storing data and a memory control circuit part 18 for controlling the memory operation. The output of the mode state identification circuit 14 is applied to the memory control circuit part 18 so that the memory array 16 is controlled and processed depending on the identified state. A chip-enable signal −CE supplied to a terminal 22 corresponds to the single clock signal inputted to the single clock memory from the outside. Unlike the PAGE signal which changes states in a non-deterministic manner (i.e., the memory does not change between ordinary and page mode at predicatable, regular intervals), as a clock signal, −CE has a very regular, deterministic period.

In the preferred embodiment, the external control signal PAGE indicates the ordinary mode by a first level and the page mode by a second level. The mode state identification circuit 14 detects the levels of the control signal in two consecutive memory cycles (preceding and current cycles) to identify the aforementioned four mode states by decoding the detected levels.

Figure 2:
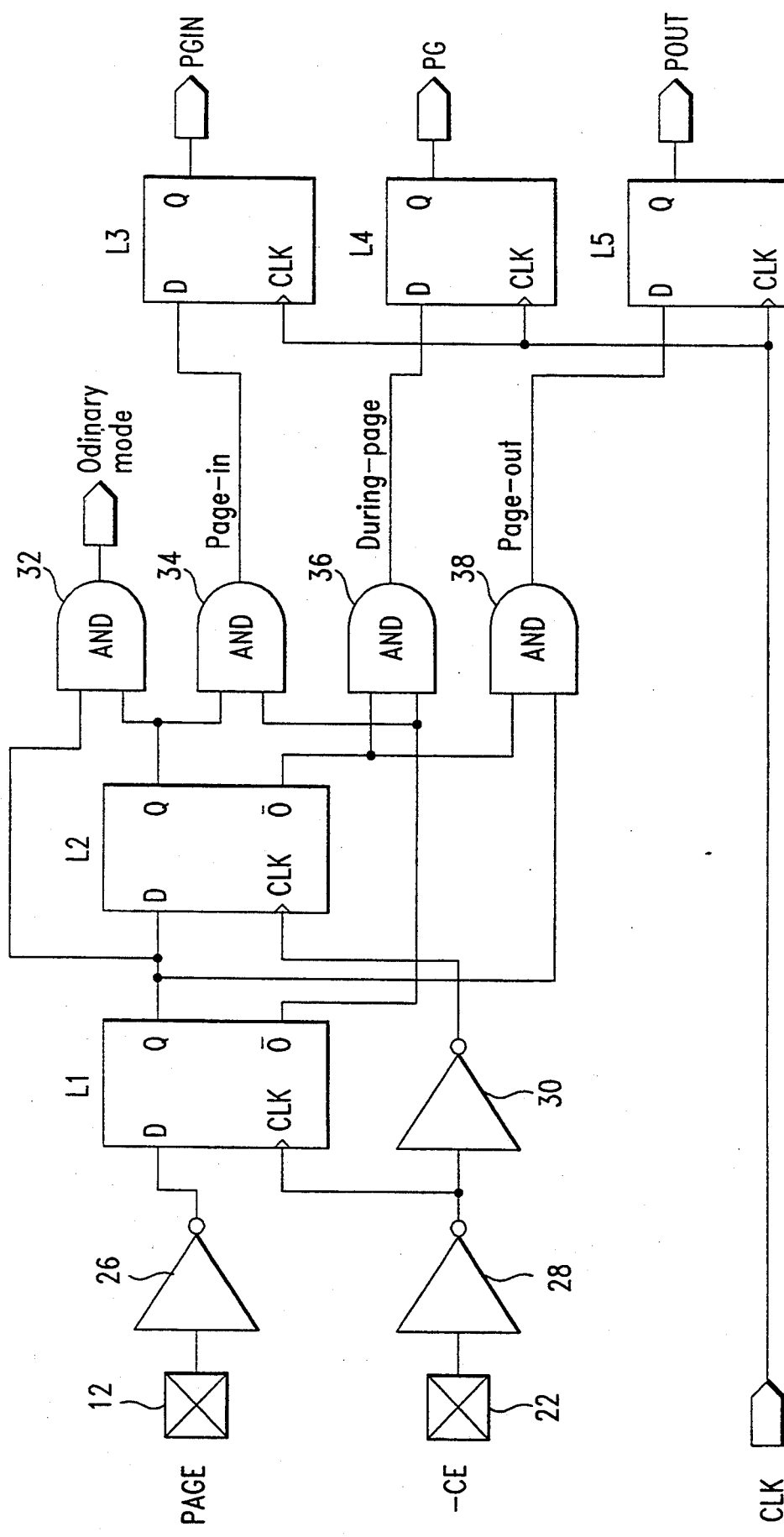
FIG. 2 is a circuit diagram showing the circuit configuration of a page-mode identification circuit 2.

Next, a preferred embodiment of the mode state identification circuit shown in FIG. 1 will be explained by referring to FIG. 2.

It is assumed that the PAGE signal applied to the terminal 12 from the outside indicates the page mode by a high level and the ordinary mode by a low level. The PAGE signal is applied to the data input D in a latch L1 via an inverter 26 while the output Q of the latch L1 is supplied to the data input D of a latch L2. The external clock signal −CE to the terminal 22 is applied to the clock input CLK of the latch L1 via an inverter 28. Furthermore, the output of the inverter 28 is applied to the clock input of the latch L2 via an inverter 30. The outputs Q of the latch L1 and the latch L2 are applied to a logic AND gate 32. The inverted output of the latch L1 and the output Q of the latch 2 are applied to an AND gate 34. The inverted outputs of the latches L1 and L2 are applied to an AND gate 36. The output Q of the latch L1 and the inverted output of the latch L2 are applied to an AND gate 38.

In operation, the PAGE signal is entered into the latch L1 by the negative transition of the clock signal −CE generated at the time of the initiation of each memory cycle. The output Q of the latch L1 is taken in the latch L2 by the positive transition of the clock signal −CE delayed by the inverter 30. In the next memory cycle, the PAGE signal is entered into the latch L1 by the negative transition of the next clock signal −CE and the output of the latch L1 is transferred to the latch L2 by the next positive transition.

Consequently, the latch L1 detects the level of the PAGE signal in the current memory cycle whereas the latch L2 detects the level of the PAGE signal in the immediately preceding memory cycle. The AND gates 32, 34, 36, and 38 decode the combinations of the levels in these two cycles to identify the operation mode states. The combinations of the levels of the PAGE signal represents the following operation mode states. "H" designates a high level and "L" designates a low level.

| The PAGE signal in the previous cycle | The PAGE signal in the current cycle | Mode state |
| --- | --- | --- |
| L | H | page-in |
| H | H | during-page |
| H | L | page-out |
| L | L | ordinary mode |

The output signals of the AND gates 32, 34, 36, and 38 represent the ordinary mode, the page-in, during-page, and the page-out. The page-in, during-page, and page-out signals are gotten into the latches L3, L4, and L5 by the clock signal CLK which is generated internally in response to −CE and supplied to terminal 40. The outputs of these latches provide page-in signal PGIN, during-page signal PG, and page-out signal PGOUT which are applied to the memory control circuit part 18 (FIG. 1) for page mode control. The output of the ordinary mode is not employed in this embodiment, but may be employed for a particular purpose depending on the control technique to be used.

In the following, a method for controlling the page mode will be explained.

As discussed above, the page mode requires a control process differing from the ordinary mode in each of the page-in, during-page, and page-out mode states. At the outset, each of the states of the ordinary mode, page-in, during-page, and page-out will be briefly described.

The ordinary mode is a memory access mode in which row and column addresses are simultaneously taken in by the external clock signal −CE. In the ordinary mode, row and column addresses are reset after memory access.

The page-in is a mode state indicating that a row address is to be held in the memory. This mode state requires the resetting of column address only.

The during-page is a mode state indicating that the memory access is performed in response to the row address held in the memory and column address inputted in each memory cycle. This mode state requires the reset of only column address after each memory access.

The page-out is a mode state indicating that the held row address and the column address in the last memory, cycle of the page mode are to be reset after the memory access.

Figure 6:
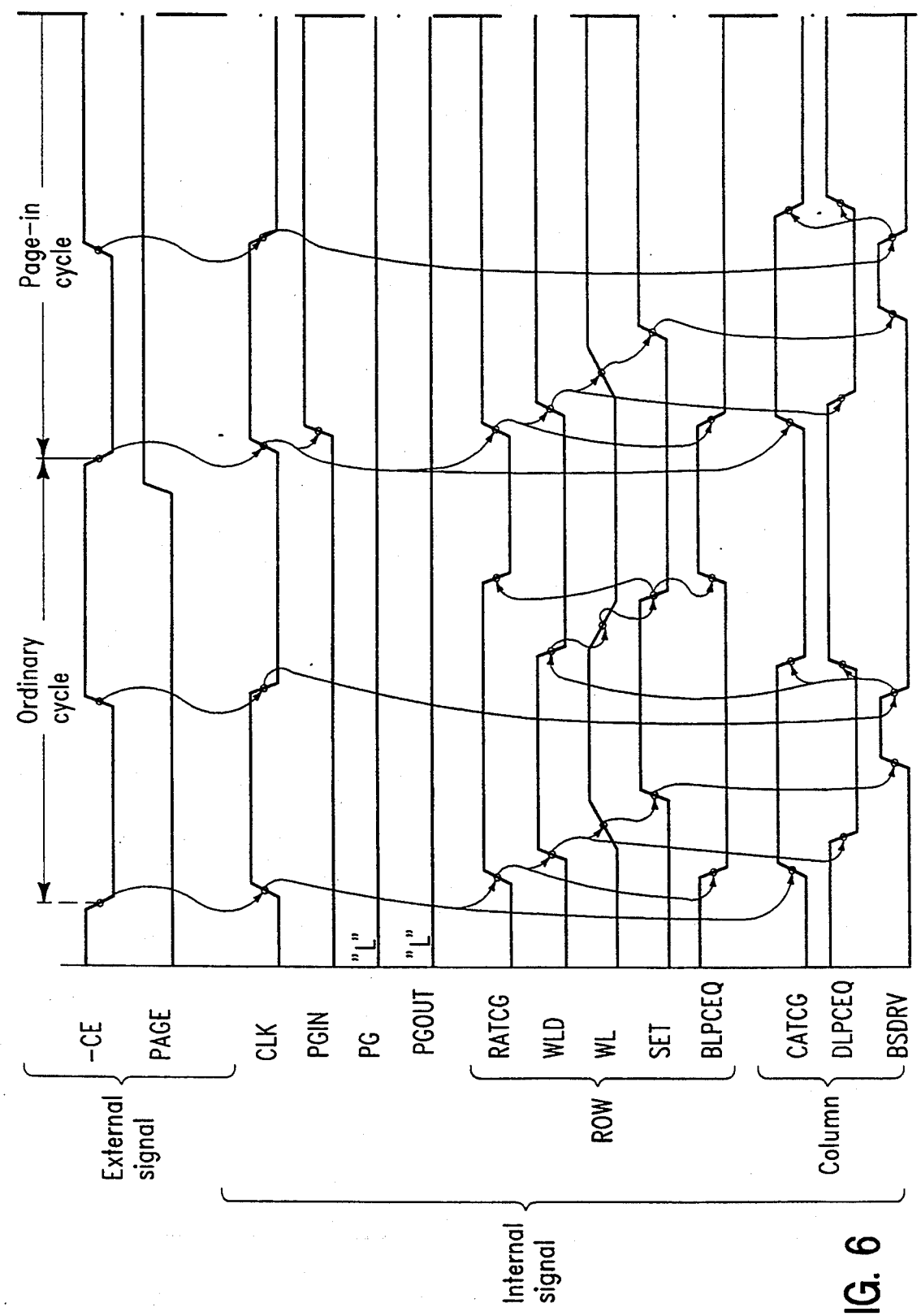
FIG. 6 is a timing chart showing the signal generation timing in the embodiment of the present invention.
Figure 7:
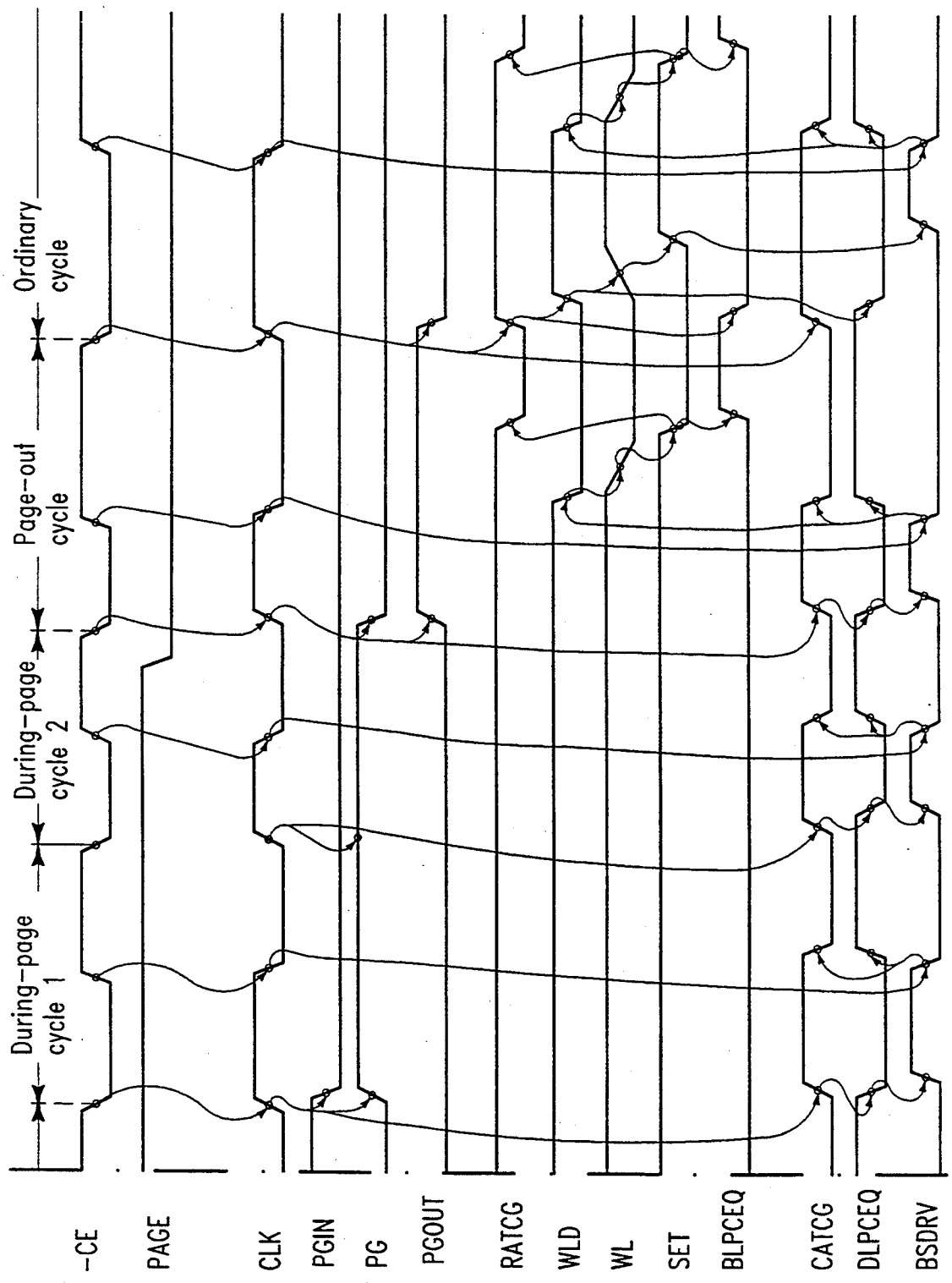
FIG. 7 is a timing chart showing the signal generation timing in the embodiment of the present invention.

Next, specific control processes will be described with reference to a DRAM by way of an example. FIG. 6 and FIG. 7 are a timing chart showing the ordinary mode of a representative DRAM and the page mode incorporated in accordance with the present invention. −CE is a single external clock signal, which generates a negative transition at the time of the initiation of each memory cycle. The PAGE signal has a settled level at the time of the negative transition of the clock signal −CE. CLK is an internal clock signal, RATCG is a row address T/C (true/complement) drive signal used for the holding and decoding of row addresses, WLD is a word line drive signal, WL is a word line voltage waveform, SET is a sense amplifier activation signal, BLPCEQ is a bit line precharge/equalize signal, CATCG is a column address T/C drive signal used for the holding and decoding of column addresses, DLPCEQ is a data line precharge/equalize signal, and BSDRV is a bit switch drive signal.

The control processing necessary for the page mode can be easily implemented by selectively omitting part of the control processes in the ordinary mode. The control processes to be omitted in the page mode are as follows.

| Cycle | Processes to be omitted |
| --- | --- |
| page-in | resetting of word line |
| | resetting of sense amplifier |
| | precharging and equalization of bit line |
| during-page | loading and decoding of row address |
| | driving of word line |
| | activation of sense amplifier |
| | resetting of word line |
| | resetting of sense amplifier |
| | precharging and equalization of bit line |
| page-out | loading and decoding of row address |
| | driving of word line |
| | activation of sense amplifier |

Figure 3:
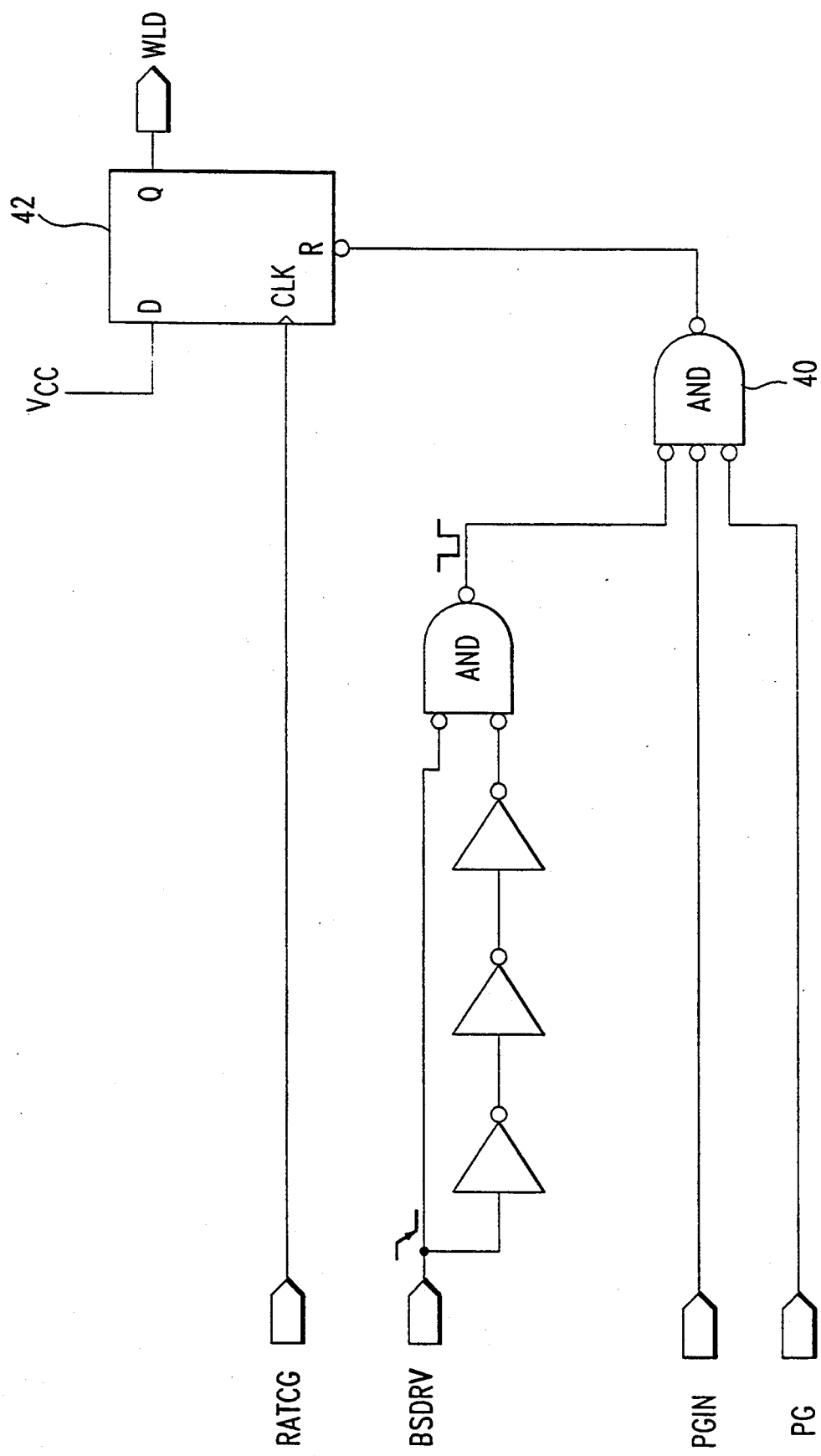
FIG. 3 is a circuit diagram showing one configuration of a WLD-signal generating circuit.

In the page-in and during-page cycles, the resetting of the word line drive signal (WLD) is omitted to hold the selected word line in driven state. This causes the resetting of RATCG to be omitted, thus holding the row address. The omission of the resetting of the word line drive (WLD) is performed with a circuit shown in FIG. 3. In the ordinary mode, the PGIN signal and PG signal are at a low level. Upon the negative transition of the BSDRV the OR 40 gate generates a low level to reset the latch 42. On the other hand, in the page-in and during-page, the PGIN signal or the PG signal go to a high level to remove the reset signal from the latch 42. The omission of the word line resetting in turn results in the omission of the resetting of the sense amplifier (SET) and the setting of the bit line precharge/equalize (BLPCEQ).

In the during-page and page-out cycles, the loading and decoding of row address (RATCG), the driving of word line (WLD/WL), and the activation of sense amplifier (SET) are also omitted since the RATCG continues to stay high when either PGIN or PG is at a high level.

Still referring to FIGS. 6 and 7, it can now be seen how changes in the control signal PAGE will determine whether the memory device operates in the ordinary mode or the page mode. For example, looking at FIG. 6, at the commencement of the timing diagram the memory is operated in the ordinary mode, as is evidenced by the fact that PAGE is low. Then, when PAGE transitions to a high signal and CLK rises, PGIN transitions to high indicating that it is the start of page cycle.

With PAGE and PGIN high and on the next rising clock edge, PG transitions high indicating that the memory is in the "during page" mode. Referring to the row and column signals in FIGS. 6 and 7, it can be seen that in the "during page" mode the row address (RATCG) is held constant, while the column address (CATCG) is changing, which is how the page mode operation is effected.

Finally, when the PAGE signal transitions to low and with PG high, on the next rising clock edge PGOUT is set high indicating that the page mode is to be terminated. Then, with PGOUT high the next rising clock edge triggers the transition of the memory back to the ordinary mode.

Figure 4:
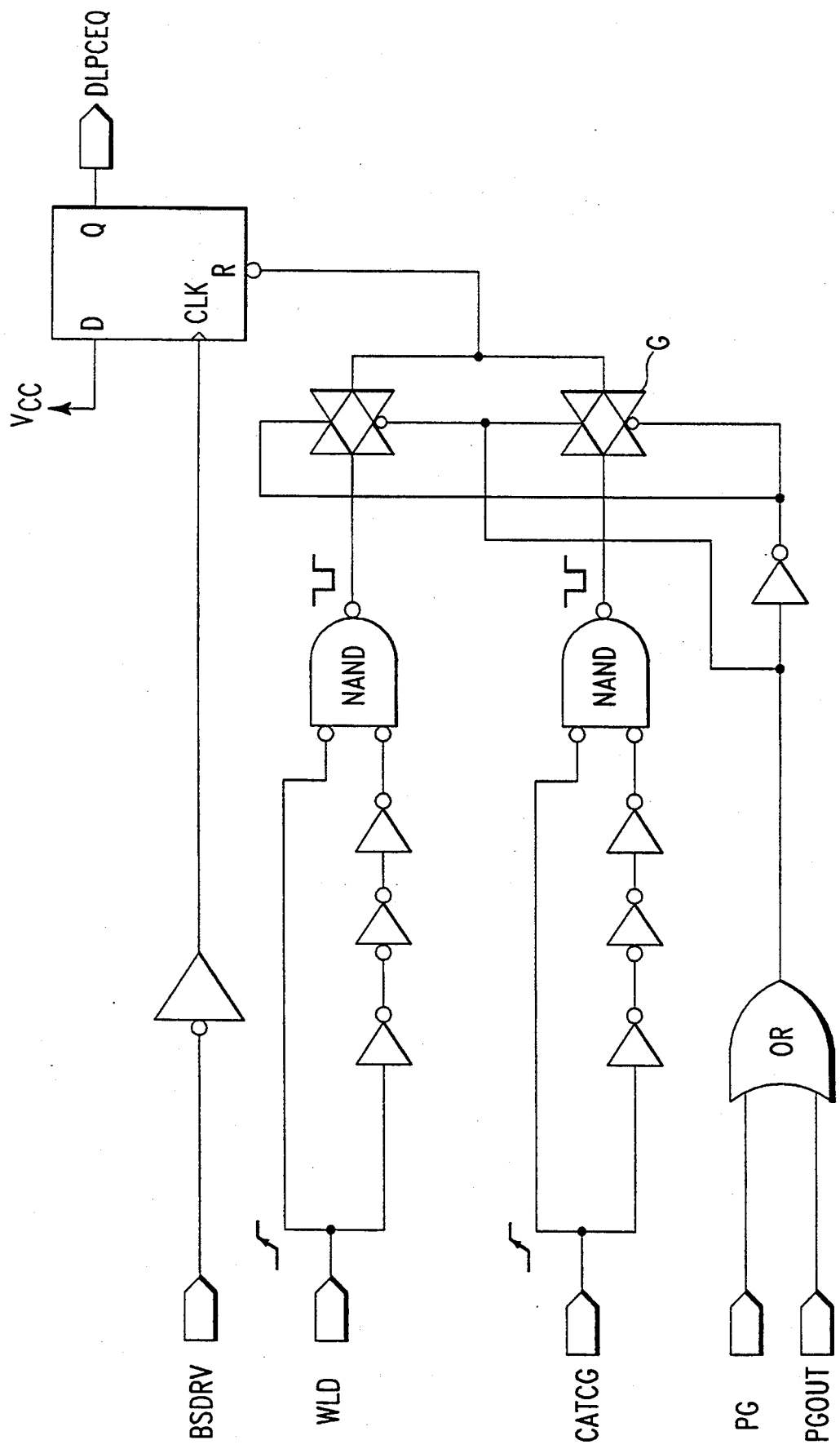
FIG. 4 is a circuit diagram showing one configuration of a DLPCEQ-signal generating circuit.
Figure 5:
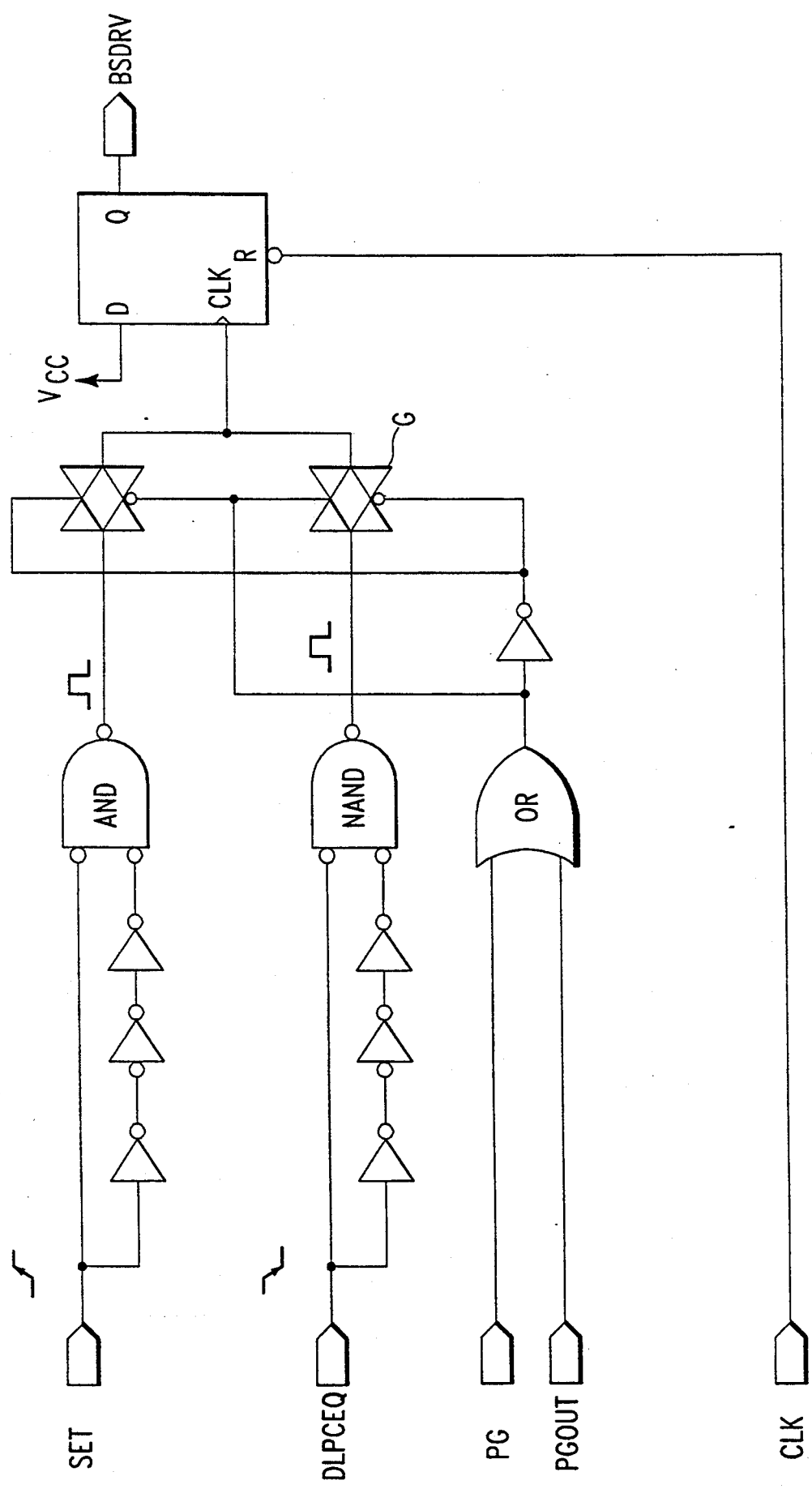
FIG. 5 is a circuit diagram showing one configuration of a BSDRV-signal generating circuit.

In the during-page and page-out, the timing of the column circuits needs to be modified. The column signals relating to data transfer to or from the outside (DLPCEQ and BSDRV in this example) must be operated after the completion of the row operation. Consequently, as shown in FIG. 6 and FIG. 7, in the ordinary mode and page-in, WLD resets the DLPCEQ and SET sets BSDRV. However, the row access phase is already terminated during the page-in and the operation of the row circuits is completed. Thus, the operation of the column circuits cannot be controlled in response to the operation of the row circuits. To solve this, in this embodiment, the column circuit timing is modified so that CATCG resets DLPCEQ and then sets BSDRV. This is carried out with the circuits shown in FIG. 4 and FIG. 5. Referring to FIGS. 4 and 5, Symbol G designates a transfer gate in which PMOS FET and NMOS FET are connected in parallel.

Referring to FIG. 4, in the ordinary mode and the page-in cycle, DLPCEQ is set by BSDRV and reset by WLD. In the during-page and page-out cycles, DLPCEQ is reset when either the PG signal or PGOUT signal is high and the CATCG signal goes high as well.

Referring to FIG. 5, the BSDRV signal is set by SET in the ordinary mode and in the page-in cycle. On the other hand, in the during-page and page-out cycles, the BSDRV signal is set when either the PG signal or the PGOUT signal is high and the DLPCEQ signal goes low.

As discussed above, the present invention can realize the memory access in page mode in a single clock memory. Only one signal line needs to be used for designating the page mode, which does not inhibit the miniaturization of the memory.

While the invention has been particularly described with reference to the preferred embodiment using a DRAM, the present invention is applicable to the case where the page mode is incorporated into a single clock SRAM. Further, the PAGE signal may denote the ordinary mode by a high level and the page mode by a low level. Furthermore, it will be apparent to those skilled in the art that other circuits can be used to control the memory without departing from the scope of the invention. Nothing in the above specification is intended to limit the invention more narrowly than the appended claims. The examples given are intended only to be illustrative rather than exclusive.

What is claimed is:

1. A single clock memory comprising:

means for determining an ordinary mode and a page mode operation of a memory, said determining means being responsive to a single, input, control signal and a single input clock signal, to produce signals representing the ordinary mode, start of page mode, during page mode, and end of page mode of the memory; and means for controlling a memory by using the signals produced by said determining means to operate the memory in the ordinary mode or the page mode.

2. The single clock memory of claim 1, wherein said determining means includes first detection means for detecting the level of said control signal in the preceding memory cycle, second detection means for detecting the level of said control signal in the current memory cycle, and decode means for decoding the levels detected by said first and said second detection means.

3. The single clock memory of claim 2, wherein said first detection means comprises a first latch for receiving said control signal and said clock signal, said second detection means comprises a second latch for receiving the output of said first latch and said clock signal, and said decode means comprises a plurality of logic gates for receiving the outputs of said first and said second latches.

4. The single clock memory of claim 1, wherein said memory control means operates to selectively omit part of the memory control operations which are usually performed in said ordinary mode, depending on the mode states of start of page mode, during-page mode, and end of page mode.

5. A memory device comprising:

storage array means in which data is stored in a plurality of memory cells arranged in a series of row and columns;

means for determining an ordinary mode and page mode operation of a memory, said determining means being responsive to a single, input, control signal and a single input clock signal, to produce signals representing the ordinary mode, start of page mode, during page mode, and end of page mode of the memory; and means for accessing the data stored in said memory array using the signals produced by said determining means to operate the memory in the ordinary mode or the page mode.

6. The memory device of claim 5, wherein said determining means comprises first detection means for detecting the level of said control signal in the preceding memory cycle and second detection means for detecting the level of said control signal in the current memory cycle.

7. The single clock memory of claim 6 wherein said first detection means comprises a first latch for receiving said control signal and said clock signal, said second means comprises a second latch for receiving the output of said first latch and said clock signal.

8. The memory of claim 7, wherein said determining means further includes a plurality of logic gates for receiving the outputs of said first and said second latches and for producing the ordinary mode, start of page mode, during page mode, and end of page mode signals.

9. A method for controlling the ordinary and page modes of a memory comprising the steps of:

processing a single, binary, control signal together with a single clock signal to produce signals corresponding to the page mode, start of page mode, during page mode, and end of page mode of the memory; and transmitting the produced signals to a memory controller means for operating the memory in the ordinary or page mode.

10. The process as in claim 9, wherein during said processing step the level of the control signal in the preceding memory cycle is factored together with the level of said control signal in the current memory cycle to determine if that level changed during the two memory cycles.

11. The process as in claim 10, wherein said operating step comprises selectively omitting certain memory control operations which are performed in the ordinary mode, depending on whether the produced signals indicate that the memory is being operated in the start page mode, during page mode, or end page mode.

* * * * *